United States Patent [19]

Perreau et al.

[11] Patent Number: 5,777,553
[45] Date of Patent: Jul. 7, 1998

[54] ELECTRONIC ARTICLE SURVEILLANCE PROTECTION FOR PRINTED CIRCUIT BOARDS

[75] Inventors: Benoit Perreau, Boca Raton, Fla.; Paul A. Kluttz, Discovery Bay, Calif.

[73] Assignee: Sensormatic Electronics Corporation, Boca Raton, Fla.

[21] Appl. No.: 709,075

[22] Filed: Sep. 6, 1996

[51] Int. Cl.$^6$ ................................................ G08B 13/187
[52] U.S. Cl. ............................................. 340/551; 340/572
[58] Field of Search .................................... 340/551, 572

[56] References Cited

U.S. PATENT DOCUMENTS

| | | | |
|---|---|---|---|
| 4,660,025 | 4/1987 | Humphrey | 340/572 |
| 5,406,264 | 4/1995 | Plonsky et al. | 340/572 |
| 5,499,015 | 3/1996 | Winkler et al. | 340/551 |

OTHER PUBLICATIONS

Knogo Strip—On Chips, Bettyann Liotta, Electronic Buyers' News [EC12] via NewsNet, Dec. 11, 1995, Issue 985, 2 pages (unnumbered).

Next Generation Computer Anti–Theft Technology Launched, PRNewswire, Jul. 10, 1996, 2 pages (unnumbered).

Does Knogo Have What It Takes to Catch a (Chip) Thief?, Herb Greenberg, San Francisco Chronicle, Jun. 7, 1996, pp. B1 and B2.

Primary Examiner—Glen Swann
Attorney, Agent, or Firm—Paul T. Kashimba

[57] ABSTRACT

A printed circuit board includes first and second layers and an electronic article surveillance tag positioned between the first and second layers. Bonding material is positioned between the first and second layers to bond the first layer, second layer and electronic article surveillance tag together. The printed circuit board can be detected by an electronic article surveillance system.

27 Claims, 2 Drawing Sheets

ELECTRONIC ARTICLE SURVEILLANCE PROTECTION FOR PRINTED CIRCUIT BOARDS

FIELD OF THE INVENTION

This invention relates to electronic article surveillance and, more particularly, to electronic article surveillance protection for printed circuit boards.

BACKGROUND OF THE INVENTION

Electronic article surveillance (EAS) systems have employed to deter and detect theft of merchandise in retail stores. In conventional systems an EAS tag is secured to an article to be protected. This tag responds to an interrogation signal from a transmitter positioned either at the exit door of the premises to be protected or at the aisleway adjacent to the cashier or point-of-sale terminal. A receiving coil generally located at the exit or aisleway receives a signal produced by the EAS tag in response to the interrogation signal from the transmitter. The presence of the response signal indicates that the EAS tag has not been removed or deactivated by the cashier and that the article bearing it may not have been paid for by the customer. A suitable alarm is activated to alert store personnel.

A similar problem has arisen in the computer industry with the theft of computer components from the factories with employees often being the culprits. The components targeted are printed circuit boards containing expensive processor or memory chips. The losses have been estimated by industry members to be in the billion dollar range and to be growing rapidly. Metal detectors have not been effective because there is often not enough metal in the computer components to be detected. In addition, it has been difficult to protect the computer components by EAS systems, because the EAS tag on the item can easily be identified and removed in the factory by an employee before he surreptitiously takes the component out of the factory.

SUMMARY OF THE INVENTION

In accordance with the present invention there is provided a printed circuit board comprising a first layer, a second layer, an electronic article surveillance tag positioned between the first and second layer, and bonding material positioned between the first and second layer to bond the first layer, second layer, and electronic article surveillance tag together.

The present invention also provides a method of making a printed circuit board comprising positioning an electronic article surveillance tag between a first and second layer of the printed circuit board, positioning bonding material between the first and second layers, and applying heat and pressure to the first layer, electronic article surveillance tag, bonding material, and second layer to cause the bonding material to bond the first layer, electronic article surveillance tag, and second layer together.

In addition, the present invention provides an electronic article surveillance system comprising means for generating an interrogation signal in an interrogation zone, a printed circuit board protected by an electronic article surveillance tag, and means for detecting the electronic article surveillance tag when the printed circuit board is in the interrogation zone and an interrogation signal is generated. The printed circuit board comprises a first layer, a second layer, an electronic article surveillance tag positioned between the first and second layers, and bonding material positioned between the first and second layers to bond the first layer, second layer, and electronic article surveillance tag together.

Other objectives, advantages, and applications of the present invention will be made apparent by the following detailed description of the preferred embodiment of the invention.

DETAILED DESCRIPTION OF PREFERRED EMBODIMENTS

Figure 1:
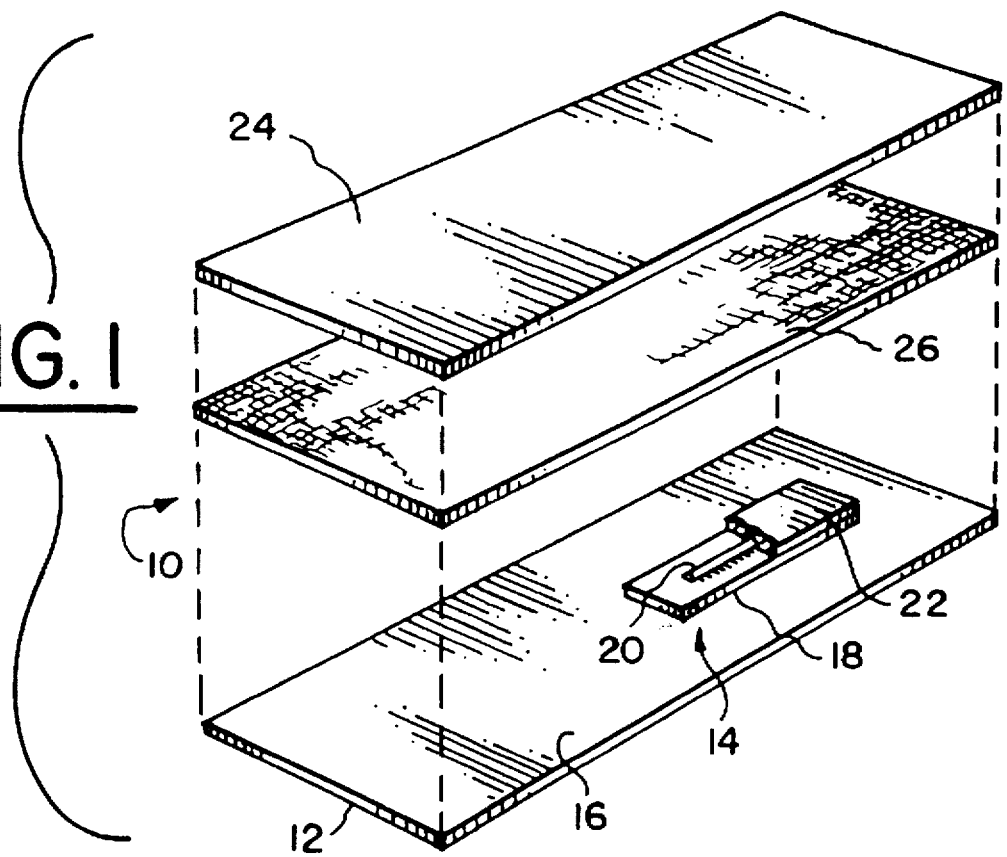
FIG. 1 is an isometric view of one embodiment of the printed circuit board of the present invention.

Referring to FIG. 1, a multilayer printed circuit board 10 has a first layer 12 which has a core of epoxy glass or other suitable material and that has a thin sheet of copper laminate or other metallic layer on one or both surfaces. The copper or other metallic layer may be etched to form a desired wiring pattern. An EAS tag 14 is positioned on surface 16 of first layer 12. EAS tag 14 has a substrate 18 which can be coated with a suitable pressure sensitive adhesive to facilitate positioning of EAS tag 14 on surface 16. Active element 20 is sandwiched between an overlayer 22 and substrate 18. With substrate 18 being made of a nonconducting material, EAS tag 14 can be placed on any location on surface 16 even if surface 16 has a copper or other metallic layer that has been etched to provide a desired wiring pattern. Active element 20 can be positioned on surface 16 by other means without subtrate 18 and overlayer 22. For example, a contact glue or other suitable cement could be used to hold active element 20 in place during construction of multilayer board 10. Alternatively, active element 20 could just simply be placed on surface 16 without any adhesive. The placement of EAS tag 14 may be dependent on the electrical insulating capabilities of the substrate or glue used. In the case where EAS tag 14 consists of active element 20 alone, EAS tag 14 must be placed where the metallic layer has been etched.

Preferably, active element 20 is a length of amorphous metal wire that has a body of magnetic material with retained stress and a magnetic hysteresis loop with a large Barkhausen discontinuity such that upon exposure of active element 20 to an external magnetic field whose field strength in the direction opposing the instantaneous magnetic polarization of active element 20 exceeds a predetermined threshold value there results a regenerative reversal of the magnetic polarization of active element 20, such as described in U.S. Pat. No. 4,660,025 which is assigned to the assignee of this application and is marketed by assignee under the trademark SensorStrip™. However, it should be understood that other active elements that produce a harmonic signal can be used.

Printed circuit board 10 has a second layer 24 which can be made of a suitable substrate and have a thickness of etched or unetched copper or other metallic layer on each surface as described in relation to first layer 12. A bonding material 26 is placed between first layer 12, EAS tag 14 and second layer 24. Bonding material 26 can be prepeg or other glass fabric that has been impregnated with an epoxy resin system and partially cured to a nontacky condition (B stage)

to bond first layer 12, EAS tag 14, and second layer 24 together when printed circuit board 10 is laminated by applying heat, pressure, and vacuum as is known in the art for constructing multilayer printed circuit boards.

Figure 2:
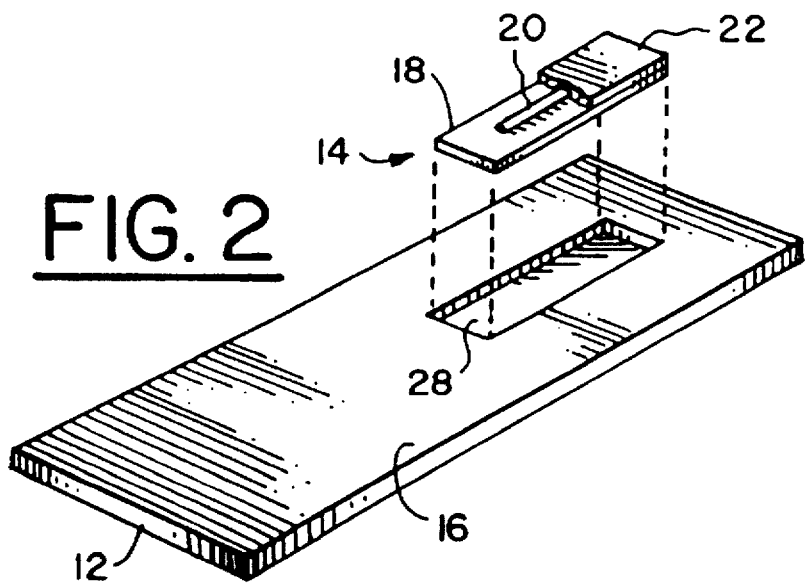
FIG. 2 is an isometric view of an alternative embodiment of the present invention.

FIG. 2 illustrates an alternative embodiment of the present invention. First layer 12 has a cavity or groove 28 in surface 16 that is sized to accommodate at least active element 20 of EAS tag 14. Groove 28 allows maximum response from active element 20 when an interrogation signal is provided as described below and active element 20 comprises a magnetostrictive element adapted to resonate mechanically at a frequency within the frequency band of the interrogation signal. Groove 28 can be created in surface 16 by cutting, scouring, drilling, etching or any other suitable method. After EAS tag 14 is positioned in groove 28, bonding material 26 and second layer 24 are added prior to lamination.

Figure 3:
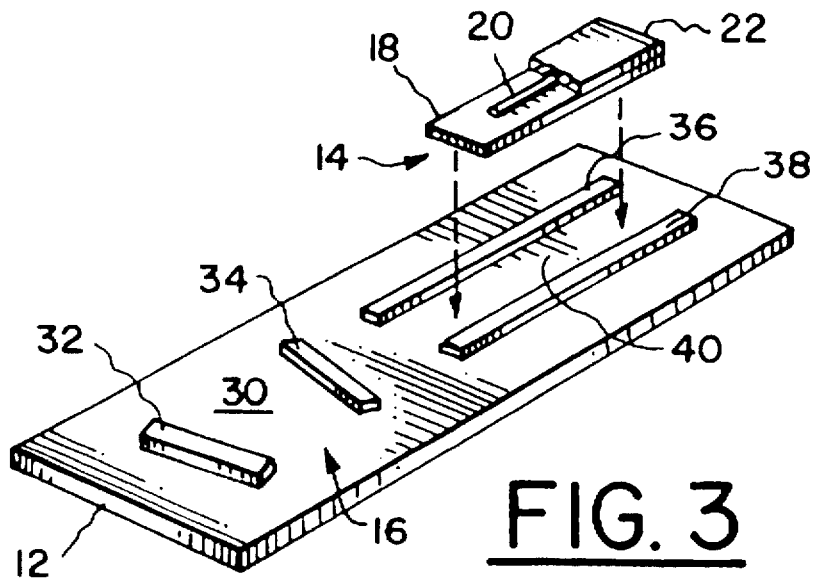
FIG. 3 is an isometric view of an alternative embodiment of the present invention.

FIG. 3 illustrates another alternative embodiment of the present invention. First layer 12 has a surface 16 that has been etched to leave an epoxy area 30 and copper paths 32, 24, 36, and 38. Paths 36 and 38 have been etched so that they are adjacent and a groove 40 is formed between them to accommodate at least active element 20 of EAS tag 14. This embodiment requires that the electrical configuration is laid out so that paths 36 and 38 are adjacent, separated enough to create a groove having the desired width to accommodate EAS tag 14, and long enough to accommodate the length of EAS tag 14.

Figure 4:
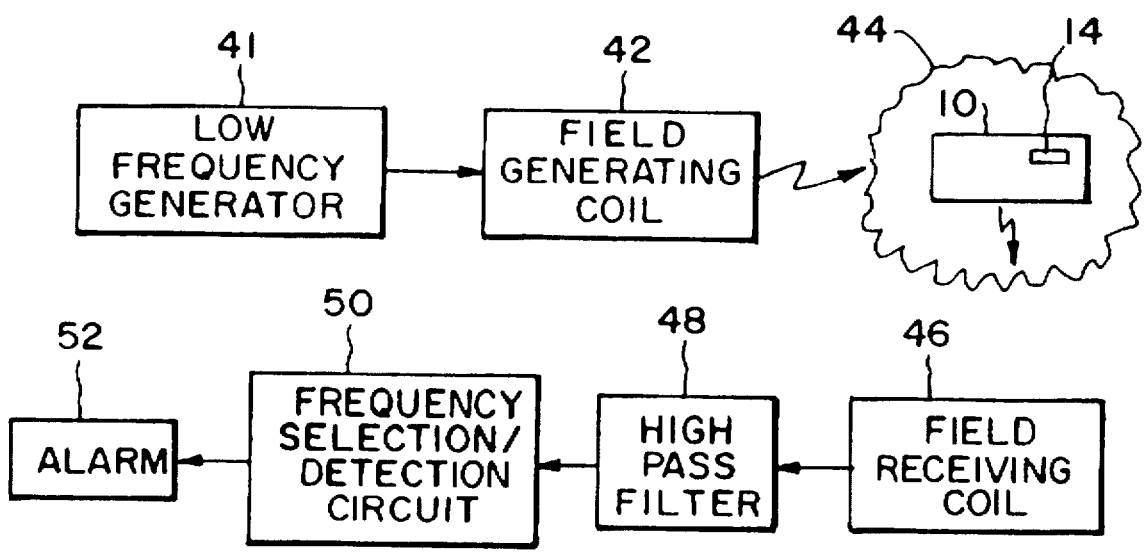
FIG. 4 is a block diagram of the electronic article surveillance system of the present invention.

An electronic article surveillance system of the present invention is shown in FIG. 4. A low frequency generator 41 drives field generating coil 42. When printed circuit board 10 containing EAS tag 14 is in the interrogation zone 44 formed by the field from coil 42, the perturbations from EAS tag 14 are received by field receiving coil 46. The output of coil 46 is passed through a high pass filter 48 having a suitable cutoff frequency. Signals passed by filter 48 are supplied to a frequency selection/detection circuit 50. Depending upon the screen provided in circuit 50, when a predetermined pattern of frequency, amplitude and/or pulse duration is detected, circuit 50 will furnish an output to activate an alarm 52.

EAS tag 14 can also take other embodiments, for example, it can be a radio frequency tag having at least one resonant frequency for detection in an electronic article surveillance system. In addition, EAS tag 14 can be a magnetomechanical marker that a magnetostrictive element that is resonant at a predetermined frequency when the biasing element has been magnetized to a predetermined level. Still further EAS tag 14 can be a radio frequency identification tag or transponder operable in an RF identification system. Any of these alternative embodiments of EAS tag 14 can be positioned in groove 28 or other suitable cavity, and in particular, the magnetomechanical and the radio frequency identification tag are well suited for use therewith. For each of the radio frequency, magnetomechanical, and radio frequency identification tags, the electronic article surveillance system would provide the appropriate interrogation signal compatible with the respective tags and detect the response of the respective tags to that interrogation signal as is known in the art.

It is to be understood that variations and modifications of the present invention can be made without departing from the scope of the invention. It is also to be understood that the scope of the invention is not to be interpreted as limited to the specific embodiments disclosed herein, but only in accordance with the appended claims when read in light of the foregoing disclosure.

What is claimed is:

1. A printed circuit board comprising:
   (a) a first layer;
   (b) a second layer;
   (c) an electronic article surveillance tag positioned between said first and second layers; and
   (d) bonding material positioned between said first and second layers to bond said first layer, second layer, and electronic article surveillance tag together.

2. A printed circuit board as recited in claim 1, wherein said first layer has a cavity and said electronic article surveillance tag is positioned in said cavity.

3. A printed circuit board as recited in claim 2, wherein said cavity comprises a groove.

4. A printed circuit board as recited in claim 3, wherein said electronic article surveillance tag comprises a body of magnetic material with retained stress and a magnetic hysteresis loop with a large Barkhausen discontinuity such that exposure of said body to an external magnetic field whose field strength in the direction opposing the magnetic polarization of said body exceeds a predetermined threshold value results in regenerative reversal of said magnetic polarization.

5. A printed circuit board as recited in claim 4, wherein said bonding material comprises prepeg.

6. A printed circuit board as recited in claim 2, wherein said electronic article surveillance tag comprises a magnetomechanical marker that includes a magnetostrictive element that is resonant at a predetermined frequency when the biasing element has been magnetized to a predetermined level.

7. A printed circuit board as recited in claim 2, wherein said electronic article surveillance tag comprises a radio frequency identification tag.

8. A printed circuit board as recited in claim 1, wherein said first layer has a metallic layer on one of its surfaces and a portion of said metallic layer is removed creating two metallic paths that are adjacent and a groove between said two metallic paths and said electronic article surveillance tag is positioned in said groove.

9. A printed circuit board as recited in claim 8, wherein said electronic article surveillance tag comprises a body of magnetic material with retained stress and a magnetic hysteresis loop with a large Barkhausen discontinuity such that exposure of said body to an external magnetic field whose field strength in the direction opposing the magnetic polarization of said body exceeds a predetermined threshold value results in regenerative reversal of said magnetic polarization.

10. A printed circuit board as recited in claim 9, wherein said bonding material comprises prepeg.

11. A printed circuit board as recited in claim 1, wherein said electronic article surveillance tag comprises a radio frequency electronic article surveillance tag.

12. A method of making a printed circuit board which comprises the steps of:
   (a) positioning an electronic article surveillance tag between a first and second layer of the printed circuit board;
   (b) positioning bonding material between the first and second layers;
   (c) applying heat and pressure to the first layer, electronic article surveillance tag, bonding material, and second layer to cause the bonding material to bond the first layer, electronic article surveillance tag and second layer together.

13. A method as recited in claim 12, further comprising the step of creating a groove in the first layer and said step of positioning an electronic article surveillance tag comprises positioning the electronic article surveillance tag in the groove in the first layer.

14. A method as recited in claim 13, wherein said step of positioning bonding material between the first and second layers comprises positioning prepeg between the first and second layers.

15. A method as recited in claim 12, further comprising the step of removing a portion of the metallic layer on one surface of the first layer to create two metallic paths that are adjacent and a groove between those two metalic paths and said step of positioning an electronic article surveillance tag comprises positioning the electronic article surveillance tag in the groove.

16. A method as recited in claim 15, wherein said step of positioning bonding material between the first and second layers comprises positioning prepeg between the first and second layers.

17. An electronic article surveillance system comprising:

(a) means for generating an interrogation signal in an interrogation zone;

(b) a printed circuit board comprising a first layer, a second layer, an electronic article surveillance tag positioned between said first and second layers, and bonding material positioned between said first and second layers to bond said first layer, second layer, and electronic article surveillance tag together; and (c) means for detecting said electronic article surveillance tag when said printed circuit board is in said interrogation zone and said generating means generates an interrogation signal.

18. An electronic article surveillance system as recited in claim 17, wherein said printed circuit board has a cavity in said first layer and said electronic article surveillance tag is positioned in said cavity.

19. An electronic article surveillance system as recited in claim 18, wherein said cavity comprises a groove.

20. An electronic article surveillance system as recited in claim 19, wherein said electronic article surveillance tag comprises a body of magnetic material with retained stress and a magnetic hysteresis loop with a large Barkhausen discontinuity such that exposure of said body to an external magnetic field whose field strength in the direction opposing the magnetic polarization of said body exceeds a predetermined threshold value results in regenerative reversal of said magnetic polarization.

21. An electronic article surveillance system as recited in claim 20, wherein said bonding material comprises prepeg.

22. An electronic article surveillance system as recited in claim 18, wherein said electronic article surveillance tag comprises a magnetomechanical marker having a magnetostrictive element and a biasing element, said magnetostrictive element being resonant at a predetermined frequency when said biasing element has been magnetized to a predetermined level.

23. An electronic article surveillance system as recited in claim 18, wherein said electronic article surveillance tag comprises a radio frequency electronic article surveillance tag.

24. An electronic article surveillance system as recited in claim 17, wherein said first layer has a metallic layer on one of its surfaces and a portion of said metallic layer is removed creating two metallic paths that are adjacent and a groove between said two metallic paths and said electronic article surveillance tag is positioned in said groove.

25. An electronic article surveillance system as recited in claim 24, wherein said electronic article surveillance tag comprises a body of magnetic material with retained stress and a magnetic hysteresis loop with a large Barkhausen discontinuity such that exposure of said body to an external magnetic field whose field strength in the direction opposing the magnetic polarization of said body exceeds a predetermined threshold value results in regenerative reversal of said magnetic polarization.

26. An electronic article surveillance system as recited in claim 25, wherein said bonding material comprises prepeg.

27. An electronic article surveillance system as recited in claim 17, wherein said electronic article surveillance tag comprises a radio frequency electronic article surveillance tag.

* * * * *

UNITED STATES PATENT AND TRADEMARK OFFICE
CERTIFICATE OF CORRECTION

PATENT NO. : 5,777,553
DATED : July 7, 1998
INVENTOR(S) : Perreau, et. al.

It is certified that error appears in the above-identified patent and that said Letters Patent is hereby corrected as shown below:

Column 3, line 46, before "a" insert --includes--.

Signed and Sealed this

Twenty-second Day of September, 1998

Attest:

BRUCE LEHMAN

Attesting Officer

Commissioner of Patents and Trademarks